United States Patent
Cho et al.

(10) Patent No.: US 8,574,445 B2
(45) Date of Patent: Nov. 5, 2013

(54) METHOD FOR GENERATING HOLLOW CATHODE PLASMA AND METHOD FOR TREATING LARGE AREA SUBSTRATE USING HOLLOW CATHODE PLASMA

(75) Inventors: Jeonghee Cho, Hwaseong-si (KR); Jong Ryang Joo, Hwaseong-si (KR); Shinkeun Park, Hwaseong-si (KR)

(73) Assignee: PSK Inc., Gyeonggi-Do (KR)

( * ) Notice: Subject to any disclaimer, the term of this patent is extended or adjusted under 35 U.S.C. 154(b) by 332 days.

(21) Appl. No.: 12/457,279

(22) Filed: Jun. 5, 2009

(65) Prior Publication Data
US 2010/0025371 A1 Feb. 4, 2010

(30) Foreign Application Priority Data

Jul. 29, 2008 (KR) ........................ 10-2008-0073822

(51) Int. Cl.
*C23F 1/00* (2006.01)

(52) U.S. Cl.
USPC ..... 216/67; 118/715; 118/723 E; 156/345.34; 156/345.33; 156/345.24; 216/71

(58) Field of Classification Search
USPC ......... 257/774; 313/542; 219/121.43, 121.59; 216/71, 67; 315/111.21, 111.81; 118/715, 723 E, 723 MW; 427/457, 427/523; 156/345.33, 345.34, 345.46; 134/22.1, 1.1; 438/710, 694, 706; 204/192.12, 298.18
See application file for complete search history.

(56) References Cited

U.S. PATENT DOCUMENTS

| | | | | |
|---|---|---|---|---|
| 4,637,853 A | * | 1/1987 | Bumble et al. | 156/345.45 |
| 4,824,544 A | * | 4/1989 | Mikalesen et al. | 204/298.06 |
| 5,472,565 A | * | 12/1995 | Mundt et al. | 216/71 |
| 6,528,432 B1 | | 3/2003 | Ngo et al. | |
| 6,902,774 B2 | | 6/2005 | Nicolussi | |
| 6,905,959 B1 | | 6/2005 | Ashtiani et al. | |
| 7,179,751 B2 | | 2/2007 | Smith et al. | |
| 7,202,176 B1 | | 4/2007 | Goto et al. | |
| 7,205,242 B2 | | 4/2007 | Ryu | |
| 7,211,525 B1 | | 5/2007 | Shanker et al. | |
| 7,247,252 B2 | | 7/2007 | Pan et al. | |
| 7,276,796 B1 | | 10/2007 | Yang et al. | |

(Continued)

FOREIGN PATENT DOCUMENTS

| | | |
|---|---|---|
| EP | 1 595 974 | 11/2005 |
| JP | 02-244624 | 9/1990 |

(Continued)

*Primary Examiner* — Duy Deo
*Assistant Examiner* — Erin Bergner
(74) *Attorney, Agent, or Firm* — Harness, Dickey & Pierce, P.L.C.

(57) ABSTRACT

Provided are a method for generating hollow cathode plasma and a method for treating a large area substrate using the hollow cathode plasma. In the methods, the hollow cathode plasma is generated by a gas introduced between a hollow cathode in which a plurality of lower grooves where plasma is generated is defined in a bottom surface thereof and a baffle in which a plurality of injection holes is defined. A substrate disposed on a substrate support member is treated using the hollow cathode plasma passing through the injection holes. The uniform plasma having high density can be generated by hollow cathode effect due to the hollow cathode having the lower grooves and the injection holes of the baffle. Also, since the substrate can be treated using a hydrogen gas and a nitrogen gas in an ashing process, a damage of a low dielectric constant dielectric can be minimized.

16 Claims, 11 Drawing Sheets

(56) References Cited

U.S. PATENT DOCUMENTS

| | | |
|---|---|---|
| 7,341,931 B2 | 3/2008 | Sharan et al. |
| 7,341,943 B2 | 3/2008 | Yeh et al. |
| 2002/0144785 A1* | 10/2002 | Srivastava et al. ....... 156/345.35 |
| 2003/0235994 A1 | 12/2003 | Pan et al. |
| 2004/0018320 A1 | 1/2004 | Nicolussi |
| 2005/0022839 A1* | 2/2005 | Savas et al. .................... 134/1.2 |
| 2005/0150601 A1* | 7/2005 | Srivastava ................ 156/345.33 |
| 2005/0215050 A1 | 9/2005 | Smith et al. |
| 2005/0227495 A1 | 10/2005 | Ryu |
| 2006/0037703 A1* | 2/2006 | Koshiishi et al. ........ 156/345.47 |
| 2006/0166507 A1 | 7/2006 | Sharan et al. |
| 2006/0178008 A1 | 8/2006 | Yeh et al. |
| 2007/0216031 A1 | 9/2007 | Yang et al. |
| 2008/0150601 A1 | 6/2008 | Nonaka |
| 2008/0164144 A1 | 7/2008 | Kishimoto et al. |

FOREIGN PATENT DOCUMENTS

| | | |
|---|---|---|
| JP | 04-297578 | 10/1992 |
| JP | 2001-226775 | 8/2001 |
| JP | 2001-271168 | 10/2001 |
| JP | 2003-68716 | 3/2003 |
| JP | 2004-343017 | 12/2004 |
| JP | 2006-156486 | 6/2006 |
| KR | 10-0464902 | 12/2004 |
| KR | 10-0716263 | 5/2007 |
| KR | 10-2007-0048492 | 9/2007 |
| KR | 10-2007-0101977 | 10/2007 |
| KR | 10-0786275 | 12/2007 |
| WO | WO 2006/095575 | 9/2006 |

* cited by examiner

METHOD FOR GENERATING HOLLOW CATHODE PLASMA AND METHOD FOR TREATING LARGE AREA SUBSTRATE USING HOLLOW CATHODE PLASMA

CROSS-REFERENCE TO RELATED APPLICATIONS

This U.S. non-provisional patent application claims priority under 35 U.S.C. §119 of Korean Patent Application No. 10-2008-0073822, filed on Jul. 29, 2008, the entire contents of which are hereby incorporated by reference.

BACKGROUND OF THE INVENTION

The present invention disclosed herein relates to a method for treating a substrate using plasma, and more particularly, to a method for generating hollow cathode plasma and a method for treating a large area substrate using the hollow cathode plasma, in which ashing, cleaning, and etching processes can be performed on a substrate such as a semiconductor wafer or a glass substrate using the plasma.

In general, various processes such as an etching process, an ashing process, and a cleaning process are required in order to manufacture a semiconductor device. Recently, the above-described processes are being performed using plasma.

An inductively coupled plasma source and a remote plasma source are being selectively used as a plasma source.

FIG. 1 is a cross-sectional view of an inductively coupled plasma (ICP) dry etching apparatus. In an ICP method, when a circular or spiral antenna 12 is installed on a chamber 11 and a high frequency power 13 is applied to the antenna 12, a current flows along a coil to generate an electric field around the coil. As a result, an induced electric field is generated inside the chamber 11 due to the electric field, and electrons are accelerated to generate plasma.

According to the ICP method, the plasma may be generated at a very low pressure, and thus, it is a great advantage to etch a fine pattern. In addition, a bias power 14 may be applied to a wafer electrode to very finely adjust an etching rate.

However, it is difficult to control a radical density at a high pressure in the ICP method. Thus, the fine pattern formation process may be performed at only a low pressure.

In recent, as a semiconductor substrate increases in size, it is required to uniformly distribute a process gas on the substrate. However, it is difficult to etch a large area and control plasma at a high pressure in a plasma etching apparatus using an inductively coupled plasma source.

FIG. 2 is a cross-sectional view of a remote plasma ashing apparatus. Referring to FIG. 2, in a remote plasma ashing apparatus, a remote plasma generator 22 is installed in a reaction gas inlet port disposed outside a chamber 21. Due to the remote plasma generator 22, energy is provided to a reaction gas to activate the reaction gas. The activated reaction gas is injected into the chamber 21 through a gas injection tube 23 to perform an ashing process.

$CF_4$, $NH_3$, $N_2$, and $O_2$ gases are mainly used as the reaction gas. Also, it is difficult to treat a large area substrate, and a plasma density is low in the remote plasma ashing apparatus.

In an ashing process, when a photoresist coated on a low dielectric constant (low-K) dielectric of the substrate is removed using the $O_2$ and $N_2$ gases, the low-k dielectric as well as the photoresist is greatly lost.

Also, in case where a high dose ion implanted photoresist disposed on an oxide material is removed using the $O_2$ and $N_2$ gases, a large amount of photoresist residues is generated.

In addition, when the ashing process is performed using the $O_2$ and $N_2$ gases, a metal of the substrate may be easily oxidized. Particularly, it may be extremely vulnerable to oxidation in case where the metal is a copper (Cu).

Since the remote plasma ashing apparatus uses a material such quartz or sappier as the plasma source, it is vulnerable to a hydrogen plasma process.

SUMMARY OF THE INVENTION

The present invention provides a method for generating hollow cathode plasma.

The present invention also provides a method for treating a large area substrate using hollow cathode plasma, in which a substrate treatment process can be efficiently performed using plasma.

The present invention also provides a method for treating a large area substrate using hollow cathode plasma, in which plasma density can increase.

The present invention also provides a method for treating a large area substrate using hollow cathode plasma, in which plasma uniformity can be improved.

The object of the present invention is not limited to the aforesaid, but other objects not described herein will be clearly understood by those skilled in the art from descriptions below.

Embodiments of the present invention provide methods for generating hollow cathode plasma including: injecting a gas between a hollow cathode in which a plurality of lower grooves where plasma is generated is defined in a bottom surface thereof and an electrode spaced from the hollow cathode to generate hollow cathode plasma between the hollow cathode and the electrode, wherein each of the lower grooves includes an inflow hole passing and extending from an upper end thereof up to a top surface of the hollow cathode, and the gas is supplied into the lower grooves through the inflow hole.

In some embodiments, the inflow hole may be provided in only a portion of the lower grooves.

In other embodiments, the lower grooves in which the inflow hole is provided among the lower grooves may be respectively disposed between the lower grooves in which the inflow hole is not provided.

In still other embodiments, the electrode may further include a heater therein.

In even other embodiments, a high frequency power may be applied to the hollow cathode, and the electrode may be grounded.

In yet other embodiments, a high frequency power may be applied to the hollow cathode and the electrode, respectively.

In further embodiments, the high frequency power applied to the hollow cathode may have a frequency ranging from about 100 kHz to about 27.12 MHz and a power ranging from about 100 W to about 10 kW, the high frequency power applied to the electrode may have a frequency ranging from about 2 MHz to about 4 MHz or a frequency of about 13.56 MHz and a power ranging from about 100 W to about 2 kW, and a pressure condition may be within a range of about 1 mTorr to about 10 Torr.

In still further embodiments, the gas may include a hydrogen gas.

In even further embodiments, the gas may include a mixed gas of the hydrogen gas and a nitrogen gas.

In other embodiments of the present invention, methods for treating a large area substrate using hollow cathode plasma include: generating the hollow cathode plasma by a gas introduced between a hollow cathode in which a plurality of lower grooves where plasma is generated is defined in a bottom surface thereof and a baffle in which a plurality of injection holes is defined; and treating a substrate disposed on a substrate support member using the hollow cathode plasma passing through the injection holes.

In some embodiments, the treating of the substrate may include removing a photoresist on the substrate.

In other embodiments, the photoresist may include a high dose ion implanted photoresist.

In still other embodiments, the photoresist may be provided on a low dielectric constant dielectric.

In even other embodiments, the low dielectric constant dielectric may be formed on a copper layer.

In yet other embodiments, the substrate support member may further include a heater therein.

In further embodiments, the substrate support member may further include a lower electrode to increase a density of plasma passing through the baffle between the baffle and the lower electrode.

In still further embodiments, a high frequency power may be applied to the hollow cathode and the lower electrode, respectively, and the baffle may be grounded.

In even further embodiments, the high frequency power applied to the hollow cathode may have a frequency ranging from about 100 kHz to about 27.12 MHz and a power ranging from about 100 W to about 10 kW, the high frequency power applied to the electrode may have a frequency ranging from about 2 MHz to about 4 MHz or a frequency of about 13.56 MHz and a power ranging from about 100 W to about 2 kW, and a pressure condition may be within a range of about 1 mTorr to about 10 Torr.

In yet further embodiments, the gas may include a hydrogen gas.

In yet further embodiments, the gas may include a mixed gas of the hydrogen gas and a nitrogen gas.

In yet further embodiments, the hollow cathode may further include an inflow hole extending from an upper end of each of the lower grooves to pass up to a top surface of the hollow cathode.

In yet further embodiments, the inflow hole may be provided in only a portion of the lower grooves.

In yet further embodiments, the lower grooves in which the inflow hole is provided among the lower grooves may be respectively disposed between the lower grooves in which the inflow hole is not provided.

In yet further embodiments, the gas may be supplied from a side direction between the hollow cathode and the baffle.

In yet further embodiments, the gas may be supplied from an upper portion of the hollow cathode through the inflow hole.

In still other embodiments of the present invention, methods for treating a large area substrate using hollow cathode plasma include: discharging a gas introduced into a process chamber providing a space in which a substrate treatment process is performed by a first plasma source using a hollow cathode effect to generate a first plasma gas; and generating a second plasma gas in which a density of the first plasma gas increases by a second plasma source.

In some embodiments, the first plasma source may be generated by a hollow cathode in which a power is applied and a plurality of lower grooves is defined in a bottom surface thereof.

In other embodiments, the second plasma source may include a capacitive coupled plasma source.

In still other embodiments, the capacitive coupled plasma source may include a baffle in which a plurality of injection holes is defined and a lower electrode provided in a substrate support member on which the substrate is mounted.

In even other embodiments, the substrate support member may further include a heater therein.

In yet other embodiments, the high frequency power applied to the hollow cathode may have a frequency ranging from about 100 kHz to about 27.12 MHz and a power ranging from about 100 W to about 10 kW, the high frequency power applied to the electrode may have a frequency ranging from about 2 MHz to about 4 MHz or a frequency of about 13.56 MHz and a power ranging from about 100 W to about 2 kW, and a pressure condition may be within a range of about 1 mTorr to about 10 Torr.

In further embodiments, the gas may include a hydrogen gas.

In still further embodiments, the gas may include a mixed gas of the hydrogen gas and a nitrogen gas.

In even further embodiments, the hollow cathode may further include an inflow hole extending from an upper end of each of the lower grooves to pass up to a top surface of the hollow cathode.

In yet further embodiments, the inflow hole may be provided in only a portion of the lower grooves.

In yet further embodiments, the lower grooves in which the inflow hole is provided among the lower grooves may be respectively disposed between the lower grooves in which the inflow hole is not provided.

In even other embodiments of the present invention, methods for treating a large area substrate using hollow cathode plasma include: supplying a gas between a hollow cathode provided in an inner upper portion of a process chamber and a substrate support member comprising a lower electrode; and applying a high frequency power to the hollow cathode and the lower electrode to generate plasma.

In some embodiments, the high frequency power applied to the hollow cathode may have a frequency ranging from about 100 kHz to about 27.12 MHz and a power ranging from about 100 W to about 10 kW, the high frequency power applied to the electrode may have a frequency ranging from about 2 MHz to about 4 MHz or a frequency of about 13.56 MHz and a power ranging from about 100 W to about 2 kW, and a pressure condition may be within a range of about 1 mTorr to about 10 Torr.

In other embodiments, the substrate support member may further include a heater therein.

In still other embodiments, the gas may include a hydrogen gas.

In even other embodiments, the gas may include a mixed gas of the hydrogen gas and a nitrogen gas.

In yet other embodiments, the hollow cathode may further include an inflow hole extending from an upper end of each of the lower grooves to pass up to a top surface of the hollow cathode.

In further embodiments, the inflow hole may be provided in only a portion of the lower grooves.

In still further embodiments, the lower grooves in which the inflow hole is provided among the lower grooves may be respectively disposed between the lower grooves in which the inflow hole is not provided.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, shapes of the elements may be exaggerated for further understanding of the present invention.

Figure 1:
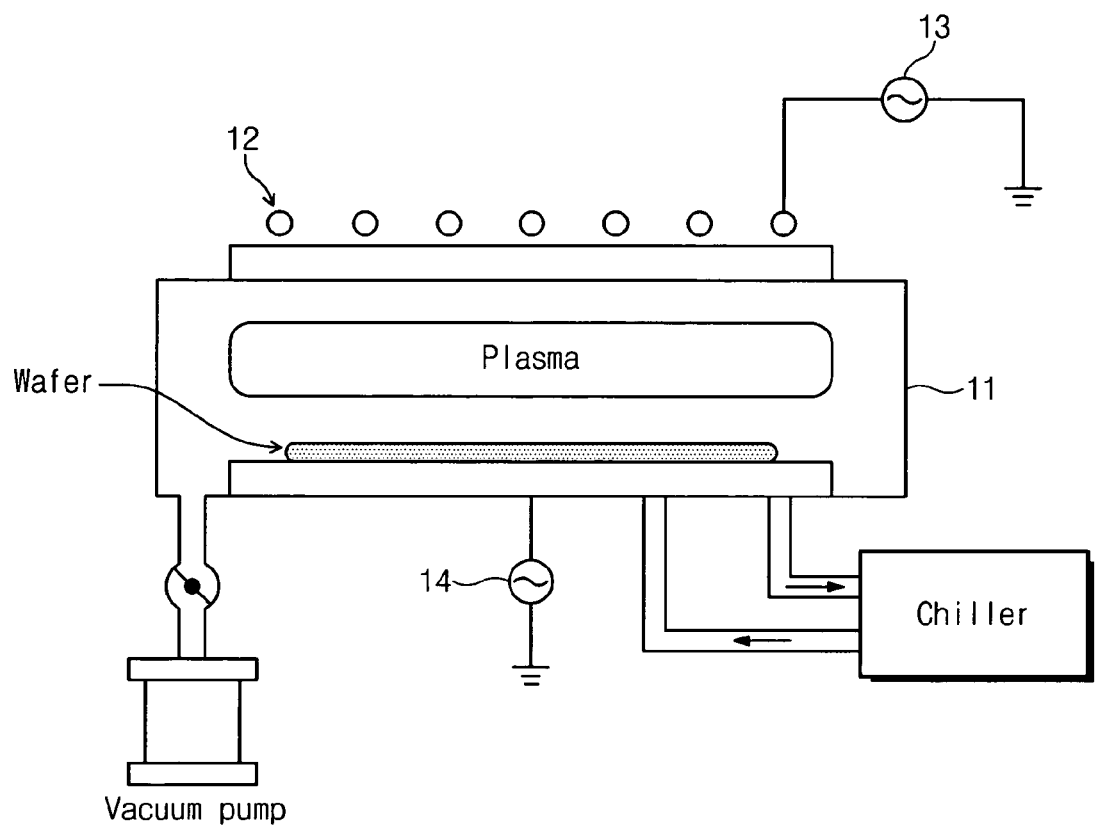
FIG. 1 is a cross-sectional view of an inductively coupled plasma etching apparatus.
Figure 2:
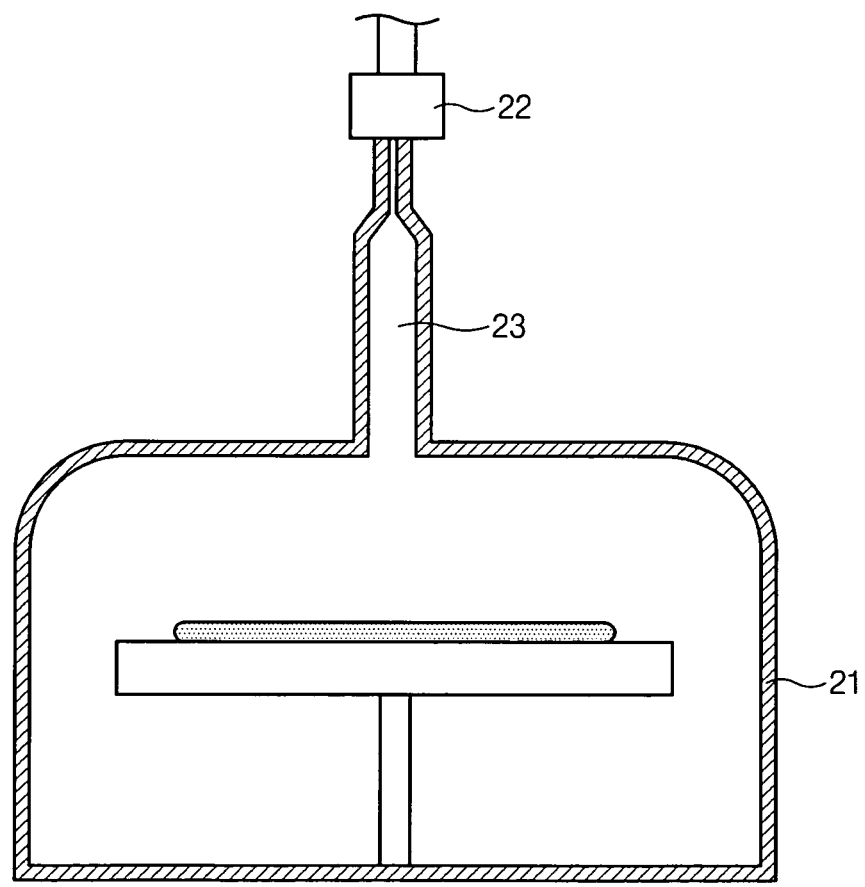
FIG. 2 is a cross-sectional view of a remote plasma ashing apparatus.
Figure 3:
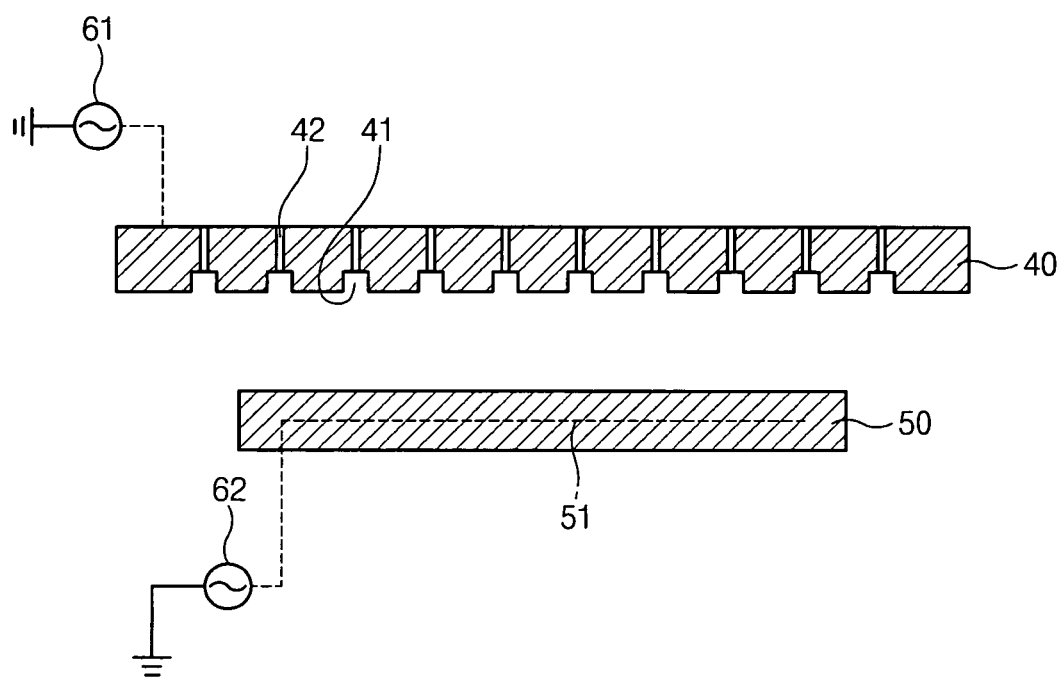
FIG. 3 is a cross-sectional view of a hollow cathode plasma generator according to the present invention.

FIG. 3 is a cross-sectional view of a hollow cathode plasma generator according to the present invention. Referring to FIG. 3, a hollow cathode plasma generator includes a hollow cathode 40, an electrode 50, and power supply sources 61 and 62.

The hollow cathode 40 has a circular plate shape. A plurality of lower grooves 41 and a plurality of inflow holes 42 are defined in the hollow cathode 40. The lower grooves 41 are defined in a bottom surface of the hollow cathode 40. The lower grooves 41 are spaces in which plasma is generated by a hollow cathode effect. The inflow holes 42 extending from an upper end of each of the lower grooves 41 and passing up to a top surface of the hollow cathode 40 is defined in the lower grooves 41, respectively. A gas is supplied into the lower grooves 41 through the inflow holes 42.

Although details are described later, each of the inflow holes 42 may be tapered so that the inflow hole 42 gradually increases in cross-sectional area from a lower portion toward an upper portion. Each of the lower grooves 41 may be tapered so that the lower groove 41 gradually increases in cross-sectional area from an upper portion toward a lower portion. Also, the inflow holes 42 may be provided in only a portion of the lower grooves 41. The lower grooves 41 in which the inflow holes 42 are provided may be disposed between the lower grooves 41 in which the inflow holes 42 are not provided, respectively.

The electrode 50 is spaced from the hollow cathode 40. The power supply sources 61 and 62 are connected to at least one of the hollow cathode 40 and the electrode 50 to supply a power thereto.

A heater 51 may be provided inside the electrode 50 to heat the substrate. In this case, a high frequency power is applied to the hollow cathode 40, and the electrode 50 is grounded.

Also, the high frequency power may be applied to the hollow cathode 40 and the electrode 50, respectively. In this case, the heater 51 may be selectively provided or be not provided.

A method for treating a large area substrate using hollow cathode plasma according to the present invention through an embodiment of a plasma treatment apparatus will be described below.

The method for treating the large area substrate using the hollow cathode plasma according to the present invention may be applicable to various processes such as an etching process, an ashing process, a cleaning process, and a surface modification process using the plasma. For reference, first to fourth embodiments of the present invention relate to a remote plasma source, and a fifth embodiment relates to an in-situ plasma source.

A method for treating a large area substrate using hollow cathode plasma according to a first embodiment of the present invention will now be described.

Figure 4:
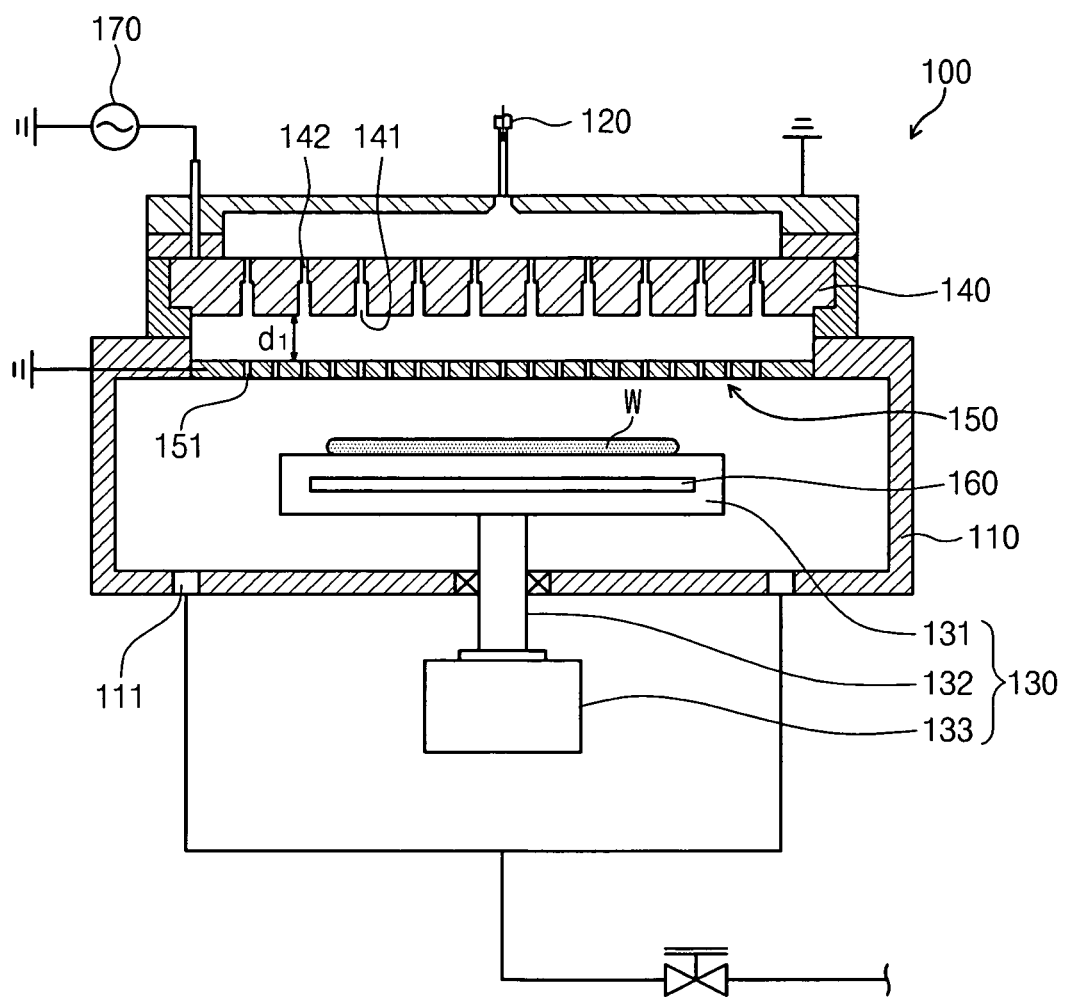
FIG. 4 is a cross-sectional view of an apparatus for treating a large area substrate using hollow cathode plasma according to a first embodiment of the present invention.

FIG. 4 is a cross-sectional view of an apparatus for treating a large area substrate using hollow cathode plasma according to a first embodiment of the present invention. Referring to FIG. 4, a substrate treatment apparatus 100 of the present invention includes a process chamber 110, a gas supply member 120, a substrate support member 130, a hollow cathode 140, a baffle 150, and a power supply source 170.

The process chamber 110 provides a space in which a substrate treatment process is performed. An exhaust hole 111 for exhausting gases is defined in a bottom surface of process chamber 110. The exhaust hole 111 is connected to an exhaust line in which a pump is installed to exhaust reaction by-products generated inside the process chamber 110 and maintains a process pressure in the process chamber 110. The gas supply member 120 supplies gases required for the substrate treatment process into the process chamber 110.

The substrate support member 130 supports a substrate W and is disposed inside the process chamber 110. The substrate support member 130 may include an electrostatic chuck and a mechanical chuck. According to the first embodiment, a heater 160 may be provided such that the substrate support member 130 can serve as a heating chuck. The power supply source 170 supplies a power to only the hollow cathode 140, and it is not necessary to supply a separate power to the substrate support member 130.

The heater 160 is provided inside the substrate support member 130 to heat the substrate W. In this case, a high frequency power is applied to the hollow cathode 140, and the substrate support member 130 is grounded. At this time, the heater 160 may range from about 25° C. to about 400° C.

Also, the high frequency power may be applied to the hollow cathode 140 and the substrate support member 130, respectively. In this case, the heater 160 may be selectively provided or be not provided.

The substrate support member 130 may be selectively fixed or rotate or be vertically moved with respect to a horizontal surface. The substrate support member 130 includes a support plate 131, a drive shaft 132, and a driver 133 to support the substrate W. The substrate W is disposed on the support plate 131 and parallel to the support plate 131. The drive shaft 132 has one end connected to a lower portion of the support plate 131 and the other end connected to the driver 133. A rotation force generated by the driver 133 is transmitted to the drive shaft 132, and the drive shaft 132 rotates together with the support plate 131.

The hollow cathode 140 is disposed inside the process chamber 110. A plurality of lower grooves 141 in which plasma is generated is defined in a bottom surface of the hollow cathode 140.

The baffle 150 is spaced from the hollow cathode 150. A plurality of injection holes 151 is defined in the baffle 150.

The gas supply member 120 is disposed above the process chamber 110. The hollow cathode 140 is disposed below the gas supply member 120, and the baffle 150 is disposed below the hollow cathode 140. The substrate support member 130 is disposed below the baffle 150.

The gas supply member 120 supplies a gas toward the hollow cathode 140. At this time, the hollow cathode 140 functions as a cathode electrode, and the baffle 150 functions as an anode electrode. The introduced gas is discharged by a hollow cathode effect through the hollow cathode 140 to generate the plasma.

The generated plasma is injected through the injection holes 151 of the baffle 150. The injected plasma reacts with the substrate W heated by the heating chuck 160 to perform the substrate treatment process. The heating chuck 160 may be heated at a temperature of about 250° C.

In case where the process chamber 110 has a generally cylindrical shape, the hollow cathode 140 and the baffle 150 may have circular plate shapes, respectively. To generate the plasma, a distance d1 spaced between the hollow cathode 140 and the baffle 150 may range from about 10 mm to about 100 mm. The hollow cathode 140 is coated with any one of an oxide layer, a nitride layer, and a dielectric coating.

According to the first embodiment, the supplied gas is discharged in the lower grooves 141 defined in the hollow cathode 140 by the hollow cathode effect to generate the plasma, and reaction plasma in which a density of the gas passing through the hollow cathode 140 is uniform is generated by the baffle 150.

Hereinafter, an operation of the baffle 150 will be described.

Two elements with respect to a process using the plasma among elements contained in the plasma generated by the hollow cathode 140 are free radicals and ions. The free radicals have an incomplete bonding and are electroneutrality. Thus, the free radicals have a very high reactivity due to the incomplete bonding. The free radicals perform a process through mainly chemical reaction with a material disposed on the substrate W. However, since the ions have an electric charge, the ions are accelerated in a certain direction according to an electric potential difference. Thus, the ions perform a process through mainly physical reaction with the material disposed on the substrate W.

The free radicals and the ions are contained also in the plasma generated by the hollow cathode 140. The free radicals are moved toward an upper portion of the substrate W to chemically react with a resist disposed on the substrate W. On the other hand, the ions having a predetermined electric charge are accelerated toward the substrate W to collide with the resist disposed on the substrate W, and thus to physically react with the resist. At this time, in case where the ions accelerated toward the substrate W collide with patterns of the resist, the fine patterns may be damaged due to the collision. The patterns disposed on the substrate W have a previously set electric charge for a next process. However, in case where the ions collide with the patterns of the substrate W, an amount of the previously set electric charge may be changed to have an effect on the next process.

The baffle 150 prevents the amount of the previously set electric charge from being changed. The free radicals of the plasma moved toward an upper portion of the baffle 150 are moved onto the substrate W through the injection holes 151 defined in the baffle 150. On the other hand, since the ions are blocked by the grounded baffle 150, the ions are not moved onto the substrate W. Thus, since only the free radicals of the plasma reach onto the substrate W, it can prevent the patterns of the substrate W from being damaged by the ions.

The baffle 150 may be formed of a metal material or formed by coating the metal material with a nonmetal material. For example, the baffle 150 may be formed of an aluminum material or an anodized aluminum material. The baffle 150 includes the plurality of injection holes 151 disposed to be spaced a predetermined distance from each other on a concentric circumference in order to uniformly supply the radicals. In case where each of the plurality of injection holes 151 defined in the baffle 150 has a circular section, the injection hole 151 has a diameter ranging from about 0.5 mm to about 3 mm. The baffle 150 is fixed to the upper portion of the process chamber 110 by a plurality of coupling members such as bolts at an edge portion thereof. As described above, the high frequency power is applied to the hollow cathode 140, and the baffle 150 is grounded. The plasma generated in the hollow cathode 140 passes through the injection holes 151 defined in the baffle 150 and is moved toward the substrate W disposed on the substrate support member 130. At this time, the charged particles such as electrons or ions are not introduced toward a lower portion of the baffle 150 by the baffle 150 formed of the aluminum material or the anodized aluminum material. Only neutral particles that do not have the electric charge such as oxygen radicals reach the substrate W disposed on the substrate support member 130 to treat the substrate W according to their purpose.

Hereinafter, the hollow cathode 140 according to embodiments will be described with reference to FIGS. 9A to 9D.

Referring to FIG. 9, the hollow cathode 140 further includes inflow holes 142 extending from an upper end of each of the lower grooves 141 and passing up to a top surface thereof. Each of the lower grooves 141 has a cross-sectional area wider than that of each of the inflow holes 142.

That is, in case where the lower groove 141 has a circular section, the circular section has a diameter ranging from about 1 mm to about 10 mm. The lower groove 141 may have a height ranging from once to twice its diameter.

Also, in case where the inflow hole 142 has a circular section, the inflow hole 142 may have a diameter d2 ranging from about 0.5 mm to about 3 mm such that the inflow hole 142 does not have an effect on the hollow cathode effect.

Although the lower groove 141 and the inflow hole 142 have the circular sections, respectively, the present invention is not limited thereto. For example, the lower groove 141 and the inflow hole 142 may have various sectional shapes, respectively.

Figure 9A:
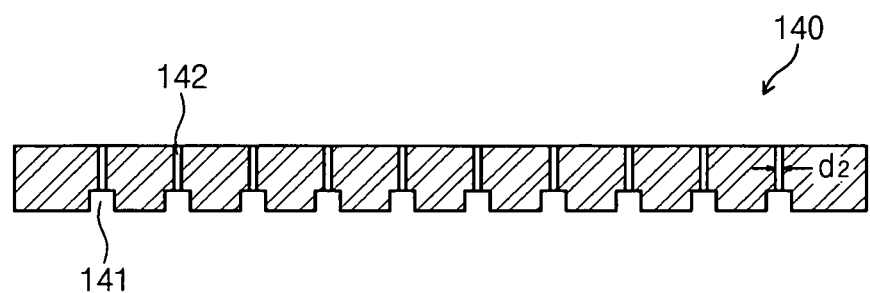
FIGS. 9A to 9D are cross-sectional views of a hollow cathode according to embodiments of the present invention.
Figure 9B:
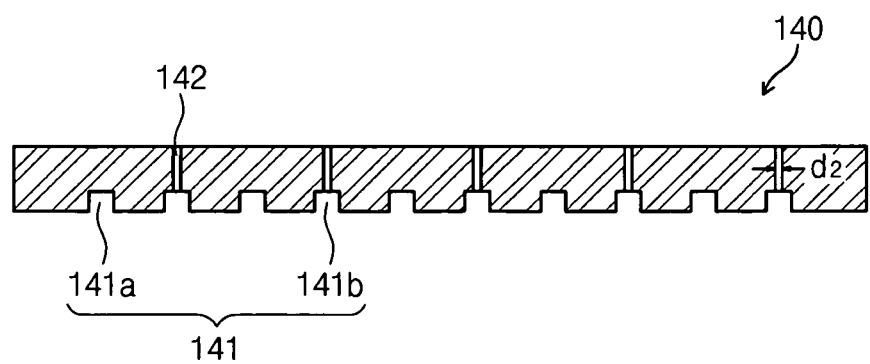

Referring to FIG. 9B, the hollow cathode 140 includes the plurality of lower grooves 141. The inflow holes 142 extending from an upper end of each of the lower grooves and passing up to a top surface thereof are provided in a portion of the lower grooves 141, respectively. At this time, lower grooves 141b in which the inflow holes 142 are respectively provided are disposed between the lower grooves 141a in which the inflow holes 142 are not provided, respectively.

The gas introduced through the previously described gas supply member 120 is plasma-discharged firstly in the lower grooves 141b in which the inflow holes 142 are respectively provided. Thereafter, the gas introduced through the gas supply member 120 is plasma-discharged in the lower grooves 141a in which the inflow holes 142 are not provided.

Each of the lower grooves 141 has a cross-sectional area wider than that of each of the inflow holes 142. In case where the lower groove 141 has a circular section, the circular section has a diameter ranging from about 1 mm to about 10 mm. The lower groove 141 may have a height ranging from once to twice its diameter.

Also, in case where the inflow hole 142 has a circular section, the inflow hole 142 may have a diameter d2 ranging from about 0.5 mm to about 3 mm such that the inflow hole 142 does not have an effect on the hollow cathode effect.

Figure 9C:
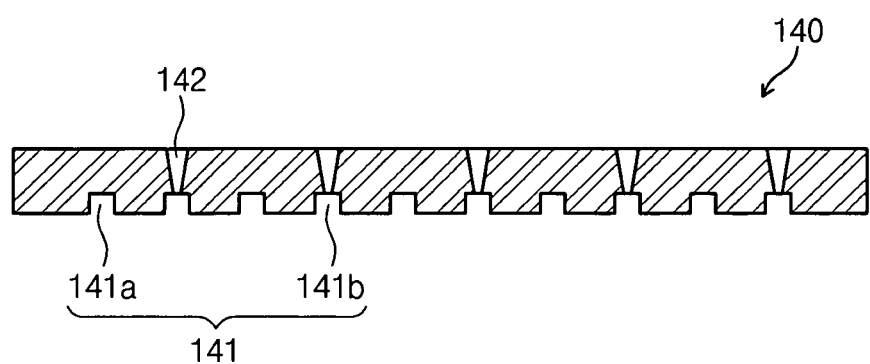

Although the lower groove 141 and the inflow hole 142 have the circular sections, respectively, the present invention is not limited thereto. For example, the lower groove 141 and the inflow hole 142 may have various sectional shapes, respectively. Referring to FIG. 9C, the inflow hole 142 may be tapered so that the inflow hole 42 gradually increases in cross-sectional area from a lower portion toward an upper portion, thereby easily introducing the gas through the inflow hole 142.

Figure 9D:
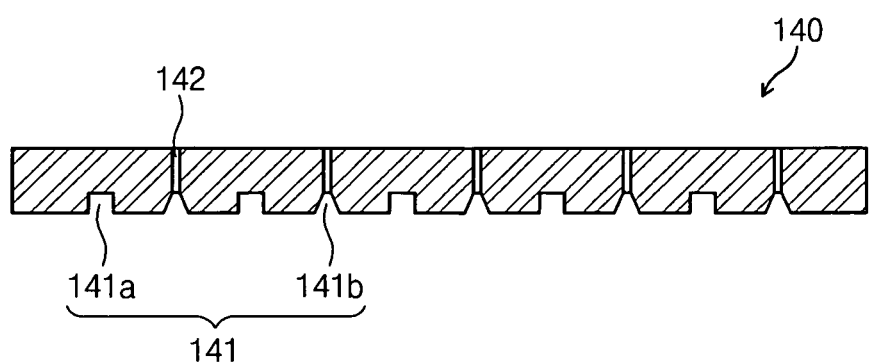

Referring to FIG. 9D, the lower groove 141 may be tapered so that the lower groove 141 gradually increases in cross-sectional area from an upper portion toward a lower portion, thereby widely spreading the generated plasma.

Of course, the configurations of the lower groove 141 and the inflow hole 142 may be variously combined with each other.

A method for treating a large area substrate using hollow cathode plasma according to a second embodiment of the present invention will now be described.

Figure 5:
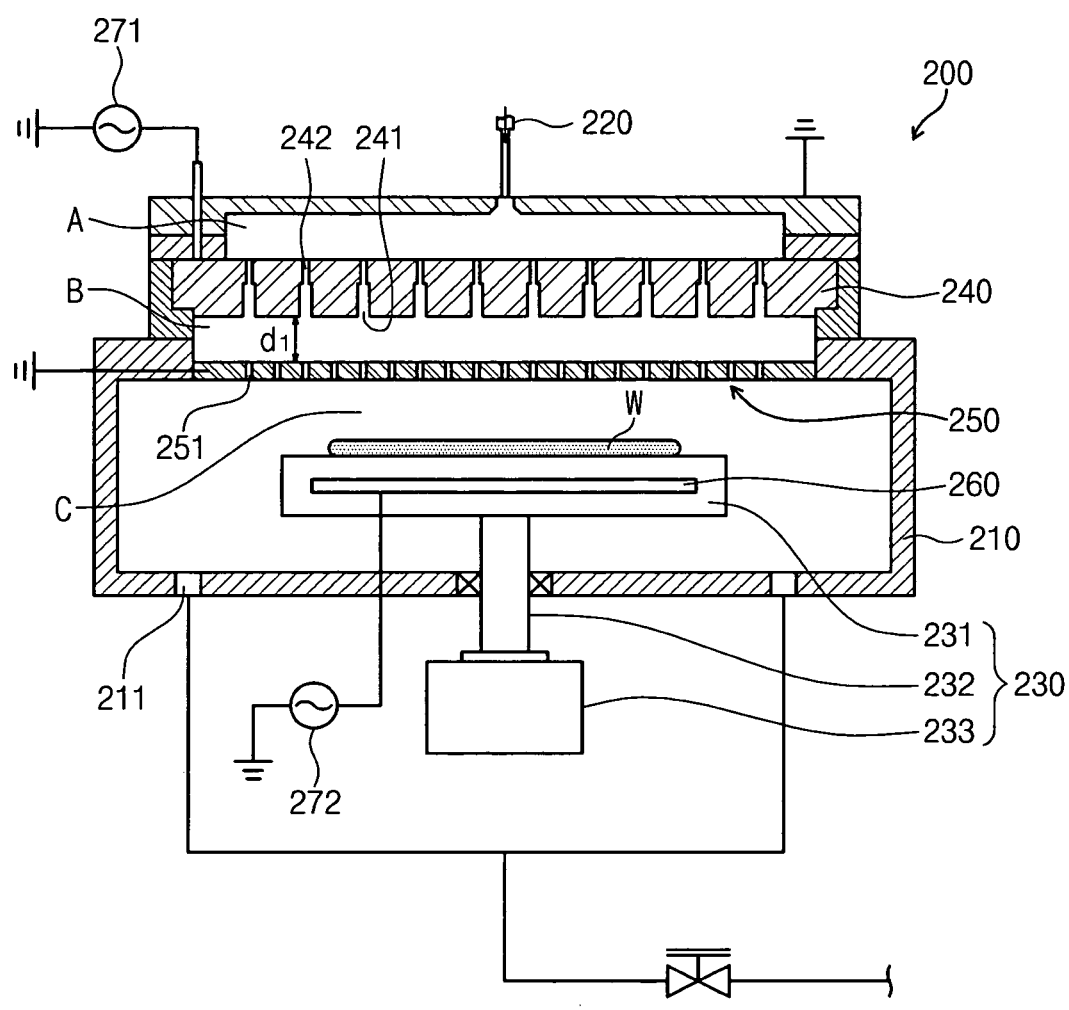
FIG. 5 is a cross-sectional view of an apparatus for treating a large area substrate using hollow cathode plasma according to a second embodiment of the present invention.

FIG. 5 is a cross-sectional view of an apparatus for treating a large area substrate using hollow cathode plasma according to a second embodiment of the present invention. Referring to FIG. 5, an apparatus 200 of treating a large area substrate using hollow cathode plasma of the present invention includes a process chamber 210, a gas supply member 220, a substrate support member 230, a hollow cathode 240, a baffle 250, a lower electrode 260, and power supply sources 271 and 272.

The process chamber 210 provides a space in which a substrate treatment process is performed. An exhaust hole 211 for exhausting gases is defined in a bottom surface of process chamber 210. The exhaust hole 211 is connected to an exhaust line in which a pump is installed to exhaust reaction by-products generated inside the process chamber 210 and maintains a process pressure in the process chamber 210. The gas supply member 220 supplies gases required for the substrate treatment process into the process chamber 210.

The substrate support member 230 supports a substrate W and is disposed inside the process chamber 210. The lower electrode 260 is provided in the substrate support member 230 and may further include an electrostatic chuck and a mechanical chuck. Of course, as shown in the first embodiment, a heater may be provided inside the substrate support member 230 to heat the substrate W.

The substrate support member 230 may be selectively fixed or rotate or be vertically moved with respect to a horizontal surface. The substrate support member 230 includes a support plate 231, a drive shaft 232, and a driver 233 to support the substrate W. The substrate W is disposed on the support plate 231 and parallel to the support plate 231. The drive shaft 232 has one end connected to a lower portion of the support plate 231 and the other end connected to the driver 233. A rotation force generated by the driver 233 is transmitted to the drive shaft 232, and the drive shaft 132 rotates together with the support plate 231.

The hollow cathode 240 is disposed inside the process chamber 210. A plurality of lower grooves 241 in which plasma is generated is defined in a bottom surface of the hollow cathode 240.

The baffle 250 is spaced from the hollow cathode 240. A plurality of injection holes 251 is defined in the baffle 250. Unlike the first embodiment, the substrate treatment apparatus 200 includes the upper power supply source 271 and the lower power supply source 272 in the second embodiment. The upper power supply source 271 applies a power to the hollow cathode 240, and the lower power supply source 272 applies the power to the lower electrode 260.

The gas supply member 220 is disposed above the process chamber 210. The hollow cathode 240 is disposed below the gas supply member 220, and the baffle 250 is disposed below the hollow cathode 240. The substrate support member 230 is disposed below the baffle 250.

The gas supply member 220 supplies a gas to a gas inflow portion A. The gas inflow portion A is a space between a top surface of the process chamber and the hollow cathode 240 disposed in an inner upper portion of the process chamber 210 as illustrated in FIG. 3.

A substrate treatment method includes discharging a gas introduced into the process chamber by a first plasma source using a hollow cathode effect to generate a first plasma gas and generating a second plasma gas in which a density of the first plasma gas increases by a second plasma source.

The first plasma source includes the hollow cathode 240 and the baffle 250, and a space between the hollow cathode 240 and the baffle 250 refers to as a first plasma generating portion B. At this time, the hollow cathode 240 functions as a cathode electrode, and the baffle 250 functions as an anode electrode. The gas introduced into the gas inflow portion A is discharged by the hollow cathode effect through the hollow cathode 240 to generate plasma. The first plasma generating portion B includes spaces provided by the lower grooves 241 of the hollow cathode 240 and the space between the hollow cathode 240 and the baffle 250.

The second plasma source includes the baffle 250 and the lower electrode 260. A space between the baffle 250 and the substrate support member 230 refers to as a second plasma generating portion C. The plasma gas generated in the first plasma generating portion B is generated again by the baffle 250 and the lower electrode 260 (This is an important difference that distinguishes the second embodiment from the first embodiment). At this time, a plasma density of the gas passing through the first plasma generating portion B is further high and uniform in the second plasma generating portion C.

In case where the process chamber 210 has a generally cylindrical shape, the hollow cathode 240 and the baffle 250 may have circular plate shapes, respectively. To generate the plasma, a distance d1 spaced between the hollow cathode 240 and the baffle 250 may range from about 10 mm to about 100 mm. The hollow cathode 240 is coated with any one of an oxide layer, a nitride layer, and a dielectric coating.

According to the second embodiment, the supplied gas is discharged in the lower grooves 241 defined in the hollow cathode 240 by the hollow cathode effect to generate the plasma, and reaction plasma in which a density of the gas passing through the hollow cathode 240 is uniform is generated by an operation of the baffle 250 and the lower electrode 260 serving as a capacitive coupled plasma (CCP) source.

As described above, the high frequency power is applied to the hollow cathode 240 and the lower electrode 260, and the baffle 250 is grounded. The plasma generated in the hollow cathode 240 passes through the injection holes 251 defined in the baffle 250 and is moved toward the substrate W disposed on the substrate support member 230. At this time, by an above-described additional function of the baffle 250, the charged particles such as electrons or ions are not introduced into the second plasma generating portion C by the baffle 250 formed of an aluminum material or an anodized aluminum material. Only neutral particles that do not have the electric charge such as oxygen radicals reach the substrate W disposed on the substrate support member 230 to treat the substrate W according to their purpose.

Since a configuration of the hollow cathode 240 according to the second embodiment is equal to that of the hollow cathode 140 of the first embodiment described with reference to FIGS. 9A and 9D, duplicate descriptions will be omitted.

A method for treating a large area substrate using hollow cathode plasma according to a third embodiment of the present invention will now be described.

Figure 6:
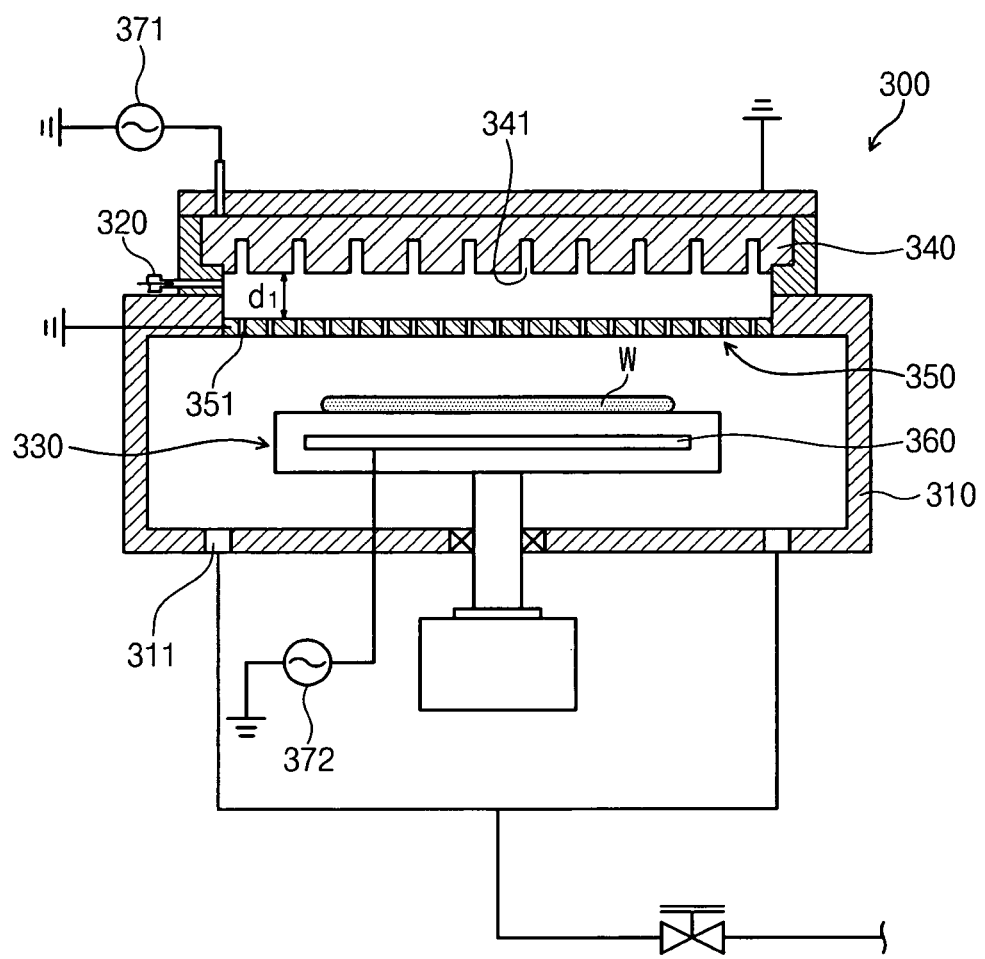
FIG. 6 is a cross-sectional view of an apparatus for treating a large area substrate using hollow cathode plasma according to a third embodiment of the present invention.

FIG. 6 is a cross-sectional view of an apparatus for treating a large area substrate using hollow cathode plasma according to a third embodiment of the present invention. Referring to FIG. 6, an apparatus 300 of treating a large area substrate using hollow cathode plasma includes a process chamber 310, a gas supply member 320, a substrate support member 330, a hollow cathode 340, a baffle 350, a lower electrode 360, and power supply sources 371 and 372.

The process chamber 310 provides a space in which a substrate treatment process is performed.

An exhaust hole 311 for exhausting gases is defined in a bottom surface of process chamber 310. The gas supply member 320 supplies the gases into the process chamber 310.

The substrate support member 330 supports a substrate W, and the lower electrode 260 is provided inside the substrate support member 330. A configuration of the substrate support member 330 according to this embodiment is equal to that of the substrate support member 230 according to the second embodiment. The substrate support member 330 is disposed in an inner lower portion of the process chamber 310. The hollow cathode 340 is disposed in an inner upper portion of the process chamber 310. A plurality of lower grooves 341 in which plasma is generated is defined in a bottom surface of the hollow cathode 340.

The baffle 350 is spaced from the hollow cathode 350 and disposed above the substrate support member 330. A plurality of injection holes 351 is defined in the baffle 350. The upper power supply source 371 applies a power to the hollow cathode 340, and the lower power supply source 372 applies the power to the lower electrode 360.

The gas supply member 320 is disposed in a lateral surface of the process chamber 310 to supply a gas between the hollow cathode 340 and the baffle 350.

According to the third embodiment, the supplied gas is discharged in the lower grooves 341 defined in the hollow cathode 340 by a hollow cathode effect to generate plasma, and reaction plasma in which a density of the gas passing through the hollow cathode 340 is uniform is generated due to an operation of the baffle 350 and the lower electrode 360 serving as a CCP source.

Since a configuration of the baffle 350 according to this embodiment is equal to that of the baffle 250 according to the second embodiment, duplicate descriptions will be omitted.

The lower grooves 341 defined in the hollow cathode 340 serve as places in which the gas introduced through the gas supply member 320 is plasma-discharged. Unlike the first and second embodiments, in the third embodiment, since the gas flows from the lateral surface of the process chamber 310, separate injection holes need not be provided in the lower grooves 341. In case where each of the lower grooves 341 has a circular section, the circular section has a diameter ranging from about 1 mm to about 10 mm. Also, each of the lower grooves 341 may have a height ranging from once to twice its diameter. Although the lower grooves 341 have the circular sections, respectively, the present invention is not limited thereto. For example, the lower grooves 341 may have various sectional shapes, respectively. The lower groove 341 may be tapered so that the lower groove 341 gradually increases in cross-sectional area from an upper portion toward a lower portion. The hollow cathode 340 is coated with any one of an oxide layer, a nitride layer, and a dielectric coating.

The hollow cathode 340 and the baffle 350 may have circular plate shapes, respectively. A distance d1 spaced between the hollow cathode 340 and the baffle 350 may range from about 10 mm to about 100 mm.

A method for treating a large area substrate using hollow cathode plasma according to a fourth embodiment of the present invention will now be described.

Figure 7:
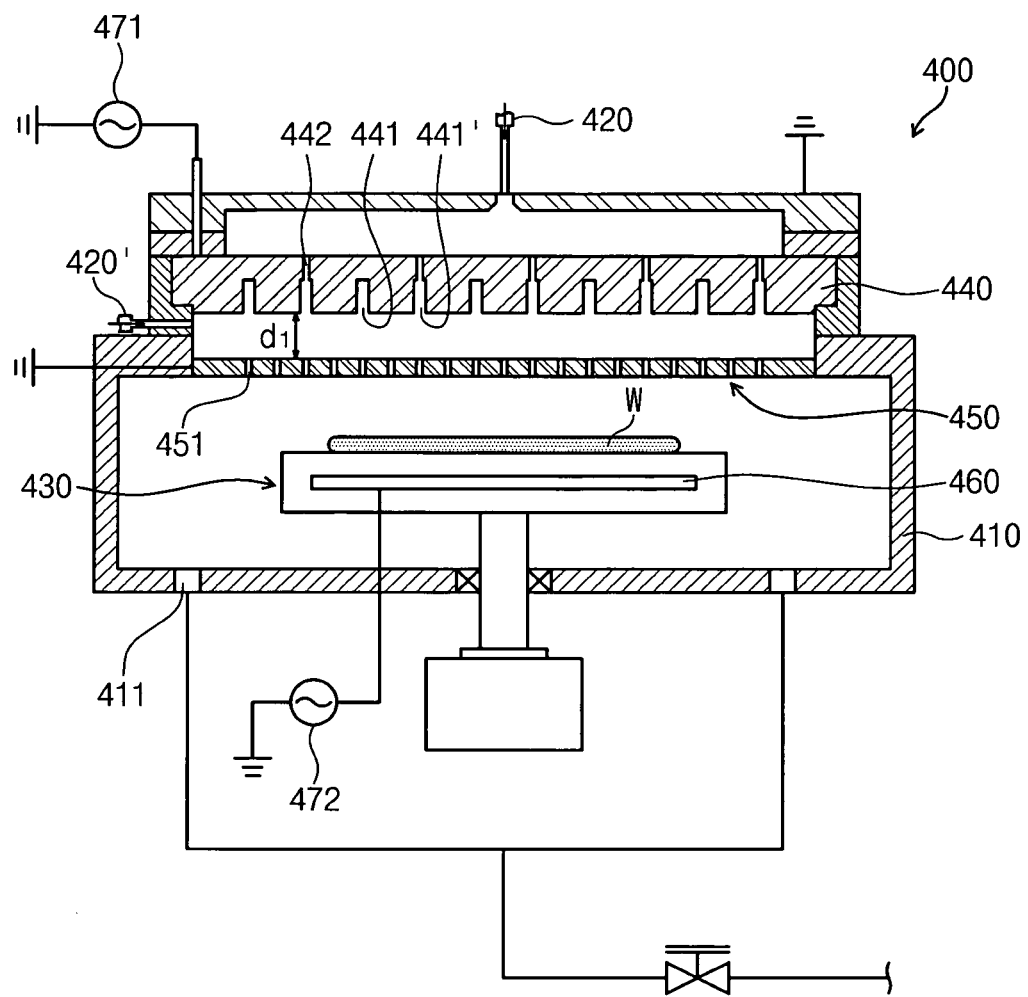
FIG. 7 is a cross-sectional view of an apparatus for treating a large area substrate using hollow cathode plasma according to a fourth embodiment of the present invention.

FIG. 7 is a cross-sectional view of an apparatus for treating a large area substrate using hollow cathode plasma according to a fourth embodiment of the present invention. Referring to FIG. 7, an apparatus 400 of treating a large area substrate using hollow cathode plasma includes a process chamber 410, first and second gas supply members 420 and 420', a substrate support member 430, a hollow cathode 440, a baffle 450, a lower electrode 460, and power supply sources 471 and 472.

The process chamber 410 provides a space in which a substrate treatment process is performed. An exhaust hole 411 for exhausting gases is defined in a bottom surface of process chamber 410. The first and second gas supply members 420 supply the gases into the process chamber 410.

The substrate support member 430 supports a substrate W and is disposed inside the process chamber 410. A configuration of the substrate support member 430 according to this embodiment is equal to that of the substrate support member 230 according to the second embodiment. The hollow cathode 440 is disposed inside the process chamber 410. A plurality of lower grooves 441 in which plasma is generated is defined in a bottom surface of the hollow cathode 440.

The baffle 450 is spaced from the hollow cathode 450. A plurality of injection holes 451 is defined in the baffle 450. The lower electrode 460 is provided in the substrate support member 430. The upper power supply source 471 applies a power to the hollow cathode 440, and the lower power supply source 472 applies the power to the lower electrode 460.

In the fourth embodiment, the gas supply member includes the first gas supply member 420 disposed in an inner upper portion of the process chamber 410 and the second gas supply member 420' disposed in a lateral surface of the process chamber 410 to supply the a gas between the hollow cathode 440 and the baffle 450. The hollow cathode 440 is disposed below the first gas supply member 420, and the baffle 450 is disposed below the hollow cathode 440. The substrate support member 430 is disposed below the baffle 450.

Similarly to the first embodiment, the hollow cathode 440 and the baffle 450 may have circular plate shapes, respectively. A distance d1 spaced between the hollow cathode 440 and the baffle 450 may range from about 10 mm to about 100 mm. The hollow cathode 440 is coated with any one of an oxide layer, a nitride layer, and a dielectric coating.

Since configurations of the hollow cathode 440 and the baffle 450 according to this embodiment are similar to those of the hollow cathode 140 according to the first embodiment and the baffle 250 according to the second embodiment, duplicate descriptions will be omitted.

A method for treating a large area substrate using hollow cathode plasma according to a fifth embodiment of the present invention will now be described.

Figure 8:
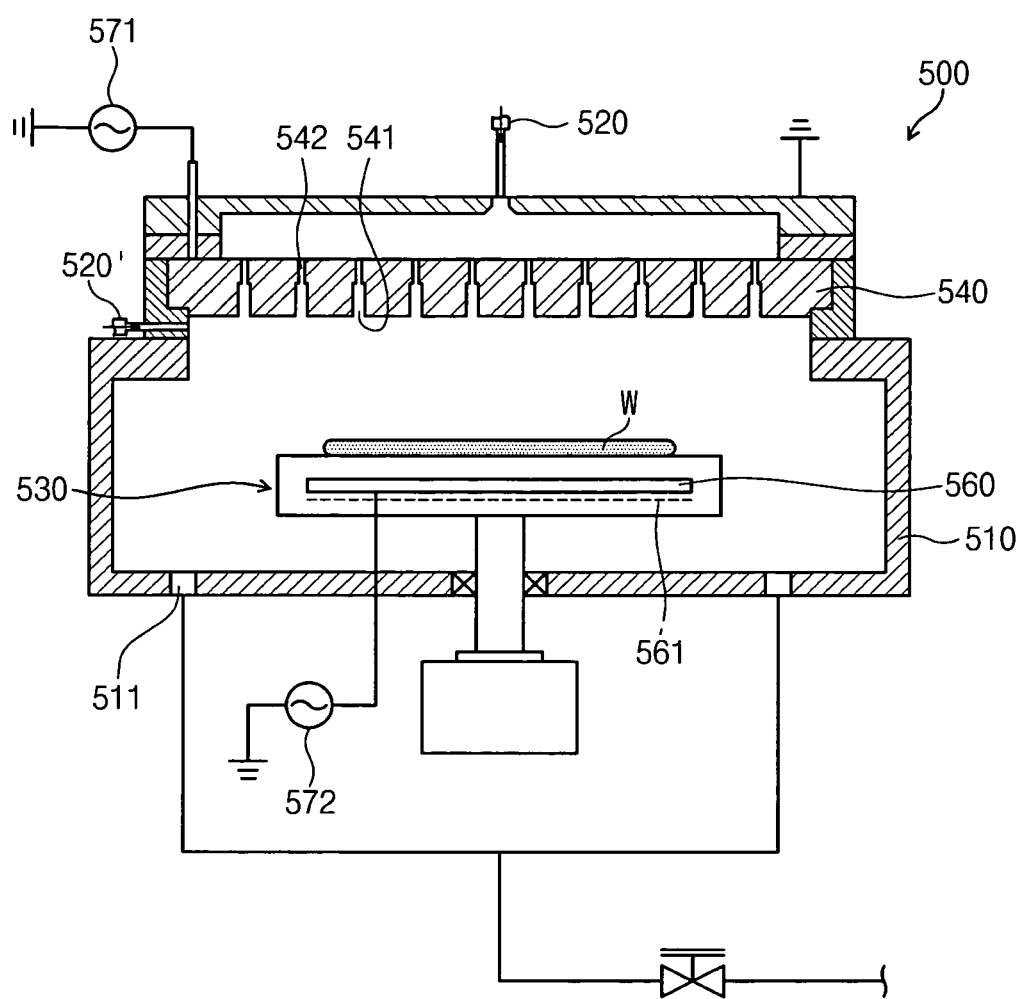
FIG. 8 is a cross-sectional view of an apparatus for treating a large area substrate using hollow cathode plasma according to a fifth embodiment of the present invention.

FIG. 8 is a cross-sectional view of an apparatus for treating a large area substrate using hollow cathode plasma according to a fifth embodiment of the present invention. Referring to FIG. 8, an apparatus 500 of treating a large area substrate using hollow cathode plasma of the present invention includes a process chamber 510, a gas supply member 520, a substrate support member 530, a hollow cathode 540, a lower electrode 560, and power supply sources 571 and 572.

The process chamber 510 provides a space in which a substrate treatment process is performed. An exhaust hole 511 for exhausting gases is defined in a bottom surface of process chamber 510. The exhaust hole 511 is connected to an exhaust line in which a pump is installed to exhaust reaction by-products generated inside the process chamber 510 and maintains a process pressure in the process chamber 510. The gas supply member 520 supplies gases required for the substrate treatment process into the process chamber 510.

The substrate support member 530 supports a substrate W and is disposed inside the process chamber 510. The lower electrode 560 is provided in the substrate support member 530 and may further include an electrostatic chuck and a mechanical chuck. Of course, a heater 561 may be further provided inside the substrate support member 530 as necessary.

The heater 561 may be provided inside the substrate support member 530 to heat the substrate W. In this case, a high frequency power is applied to the hollow cathode 540, and the substrate support member 530 is grounded.

Also, the high frequency power may be applied to the hollow cathode 540 and the substrate support member 530, respectively. In this case, the heater 560 may be selectively provided or be not provided.

The substrate support member 530 may be selectively fixed or rotate or be vertically moved with respect to a horizontal surface. The substrate support member 530 includes a support plate 531, a drive shaft 532, and a driver 533 to support the substrate W.

The hollow cathode 540 is disposed inside the process chamber 510. A plurality of lower grooves 541 in which plasma is generated is defined in a bottom surface of the hollow cathode 540.

Unlike the first to fourth embodiments, a baffle is not provided in the fifth embodiment. The upper power supply source 571 applies a power to the hollow cathode 540, and the lower power supply source 572 applies the power to the lower electrode 560.

The gas supply member 520 is disposed above the process chamber 510. The hollow cathode 540 is disposed below the gas supply member 520, and the substrate support member 530 is disposed in an inner lower portion of the process chamber 510.

The gas supply member 520 supplies a gas to the hollow cathode 540. The gas introduced from the gas supply member 520 is discharged by a hollow cathode effect through the hollow cathode 540 to generate plasma.

In case where the process chamber 510 has a generally cylindrical shape, the hollow cathode 540 has a circular plate shape. The hollow cathode 540 is coated with any one of an oxide layer, a nitride layer, and a dielectric coating.

According to the fifth embodiment, the supplied gas is discharged in the lower grooves 541 defined in the hollow cathode 540 by the hollow cathode effect to generate the plasma.

Since the hollow cathode 540 according to the fifth embodiment is equal to that of the hollow cathode 140 of the first embodiment described with reference to FIGS. 9A and 9D, duplicate descriptions will be omitted.

As described above, in the substrate treatment method according to the first to fourth embodiments, the hollow cathode plasma is generated by the introduced gas between the hollow cathode in which the plurality of lower grooves where the plasma is generated is defined in the bottom surface thereof and the baffle in which the plurality of injection holes is defined. The substrate disposed on the substrate support member is treated by the hollow cathode plasma passing through the injection holes.

In the substrate treatment method according to the fifth embodiment, the gas is supplied between the hollow cathode provided in the inner upper portion of the process chamber and the substrate support member including the lower electrode, and the high frequency power is applied to the hollow cathode and the lower electrode to generate the plasma.

Process conditions of the present invention will be described.

A hydrogen ($H_2$) gas is used as a process gas. For example, a mixed gas in which the $H_2$ gas is mixed with a nitrogen ($N_2$) gas may be used as the process gas. At this time, supply amounts of the $H_2$ gas and the $N_2$ gas may range from about 1 SLM (standard liter per minute) to about 20 SLM, respectively. That is, according to the present invention, the H2 gas may be used in the ashing process. A supply ratio of $H_2$ gas: $N_2$ gas may be selectively applied as necessary at various ratios of 9:1, 8:2, 7:3, 6:4, 5:5, 4:6, 3:7, 2:8, and 1:9. Also, $H_2$ and He, $H_2$, $CF_4$, and He, and $H_2$ and $CF_4$ instead of $H_2$ and $N_2$ may be used. At this time, $CF_4$ may be supplied at a flow rate of about 1000 sccm (standard cubic centimeters per minute), and He may be supplied at a flow rate of about 1000 sccm.

A frequency ranging from about 100 kHz to about 27.12 MHz and a power ranging from about 100 W to about 10 kW may be applied to the hollow cathode. A frequency ranging from about 2 MHz to about 4 MHz or a frequency of about 13.56 MHz and a power ranging from about 100 W to about 2 kW may be applied to the electrode (or the lower electrode).

A power having a frequency of about 13.56 MHz is supplied to a general upper electrode, but a power having a frequency greater than 13.56 MHz can be supplied to the hollow cathode of the present invention to increase the density of the plasma.

In addition, since a pressure condition of the substrate treatment of present invention may be applicable to a pressure range from about 1 mTorr to about 10 Torr, the process of the present invention can be performed at a high pressure as well as a low pressure.

According to the method for generating the hollow cathode plasma and the method for treating the large area substrate using the hollow cathode plasma, the plasma having a high density (about $10^{12}/cm^3$) may be provided. Also, since the uniform plasma can be provided, the substrate treatment process may be applicable to a semiconductor process for treating the large area substrate. In addition, the substrate treatment process may be performed at the low pressure and the high pressure. When the hollow cathode plasma is used, since an electron temperature is less than 5 eV, the damage of the substrate may be minimized.

Figure 10:
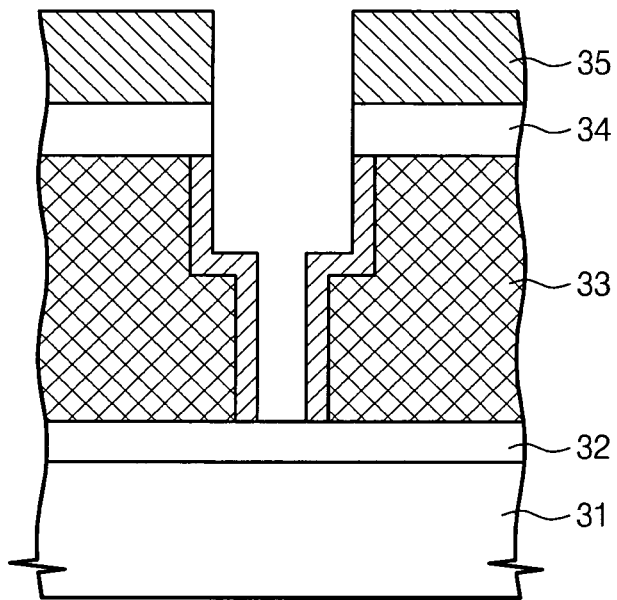
FIGS. 10 and 11 are cross-sectional views of a substrate used in a substrate treatment process.
Figure 11:
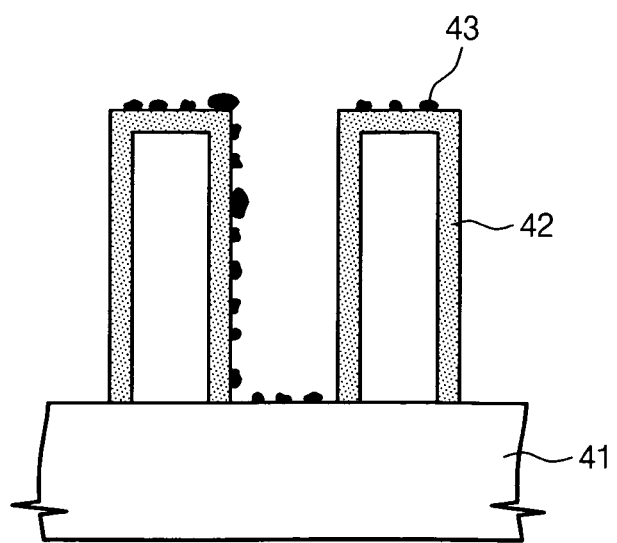

FIGS. 10 and 11 are cross-sectional views of a substrate used in a substrate treatment process.

The substrate treatment process of the present invention may include a process for removing a photoresist on the substrate, i.e., the ashing process. At this time, the photoresist may be provided on a low dielectric constant (low-K) dielectric. Also, the low-K dielectric may be disposed on a copper (Cu) layer.

Referring to FIG. 10, a substrate using in an ashing process of the present invention may include a substrate in which a Cu layer 31, an etch barrier layer 32, a low-K dielectric 33, a capacitance 34, and a photoresist 35 are vertically disposed in order. When the ashing process is performed on the substrate using $H_2$ and $N_2$ gases, damage of the low-K dielectric 33 may be minimized.

Referring to FIG. 11, a substrate of the present invention may include a substrate in which a high dose ion implanted photoresist is provided. In this case, when the photoresist disposed on an oxide material 41 is removed using $H_2$ gas, $N_2$ gas, and hollow cathode plasma, a generation of photoresist residues 43 may be minimized. Also, it may prevent a metal layer (specifically, a Cu layer) disposed on the substrate from being oxidized.

According to the method for generating the hollow cathode plasma and the method for treating the large area substrate using the hollow cathode plasma, the plasma having the high density can be provided by the hollow cathode effect due to the hollow cathode in which the lower grooves are defined.

The plasma can be generated with two times by the hollow cathode and the injection holes of the baffle to provide the uniform plasma having the high density.

Since the plasma can be uniformly provided over a large area, it can be applicable to the semiconductor process for treating the large area substrate.

The electron temperature of the plasma can be low to minimize the damage of the substrate.

The hollow cathode plasma can be used to treat the substrate using the $H_2$ gas and the $N_2$ gas in the ashing process.

The substrate treatment process can be performed at the low pressure and the high pressure.

The $H_2$ gas and the $N_2$ gas can be used to minimize the damage of the low-K dielectric.

In case where the high dose ion implanted photoresist is removed, the photoresist residues can be easily removed.

It can prevent the metal layer (specifically, the Cu layer) disposed on the substrate from being oxidized in the process for ashing the metal substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for treating a large area substrate using hollow cathode plasma, the method comprising:
   supplying a gas through an inflow hole defined in a hollow cathode,
   generating a hollow cathode plasma by introducing the gas between the hollow cathode in which a plurality of lower grooves where plasma is generated is defined in and provided across the entire bottom surface thereof and a baffle in which a plurality of injection holes is defined; and
   treating a substrate disposed on a substrate support member using the hollow cathode plasma passing through the injection holes,
   wherein the inflow hole extends from an upper end of some of the lower grooves to a top surface of the hollow cathode, and the lower grooves provided with the inflow hole are respectively disposed between the lower grooves not provided with the inflow hole.

2. The method of claim 1, wherein the treating of the substrate comprises removing a photoresist on the substrate.

3. The method of claim 2, wherein the photoresist comprises a high dose ion implanted photoresist.

4. The method of claim 2, wherein the photoresist is provided on a low dielectric constant dielectric.

5. The method of claim 4, wherein the low dielectric constant dielectric is formed on a copper layer.

6. The method of claim 1, wherein the substrate support member further comprises a heater therein.

7. The method of claim 1, wherein the substrate support member further comprises a lower electrode to increase a density of plasma passing through the baffle between the baffle and the lower electrode.

8. The method of claim 7, wherein a high frequency power is applied to the hollow cathode and the lower electrode, respectively, and the baffle is grounded.

9. The method of claim 8, wherein the high frequency power applied to the hollow cathode has a frequency ranging from about 100 kHz to about 27.12 MHz and a power ranging from about 100 W to about 10 kW, the high frequency power applied to the electrode has a frequency ranging from about 2 MHz to about 4 MHz or a frequency of about 13.56 MHz and a power ranging from about 100 W to about 2 kW, and a pressure condition is within a range of about 1 mTorr to about 10 Torr.

10. The method of claim 1, wherein the gas comprises a hydrogen gas.

11. The method of claim 10, wherein the gas comprises a mixed gas of the hydrogen gas and a nitrogen gas.

12. The method of claim 1, wherein the gas is supplied from a side direction between the hollow cathode and the baffle.

13. The method of claim 1, wherein the hollow cathode and the baffle are disposed inside a process chamber.

14. The method of claim 1, wherein the hollow cathode and the baffle are biased as a cathode electrode and an anode electrode, respectively, to generate the plasma therebetween.

15. The method of claim 14, further comprising:
   grounding the baffle to prevent ions included in the plasma from reaching onto the substrate.

16. The method of claim 1, further comprising:
   increasing at least one of a density and an uniformity of the plasma by the baffle and the substrate support member,
   wherein the baffle and the substrate support member are biased as a cathode electrode and an anode electrode, respectively.

* * * * *